(12) United States Patent
Seo

(10) Patent No.: US 9,666,240 B2
(45) Date of Patent: May 30, 2017

(54) SEMICONDUCTOR DEVICE WITH DECREASED OVERLAPPING AREA BETWEEN REDISTRIBUTION LINES AND SIGNAL LINES

(71) Applicant: SK hynix Inc., Incheon-si, Gyeonggi-do (KR)

(72) Inventor: Hyun Chul Seo, Yongin-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/051,922

(22) Filed: Feb. 24, 2016

(65) Prior Publication Data
US 2017/0110161 A1   Apr. 20, 2017

(30) Foreign Application Priority Data

Oct. 19, 2015  (KR) .......................... 10-2015-0145251

(51) Int. Cl.
| | |
|---|---|
| *H01L 23/48* | (2006.01) |
| *G11C 5/06* | (2006.01) |
| *H01L 23/528* | (2006.01) |
| *H01L 23/00* | (2006.01) |
| *G11C 11/408* | (2006.01) |
| *G11C 11/4094* | (2006.01) |
| *G11C 16/08* | (2006.01) |
| *G11C 16/24* | (2006.01) |
| *H01L 23/50* | (2006.01) |

(52) U.S. Cl.
CPC .......... *G11C 5/063* (2013.01); *G11C 11/4085* (2013.01); *G11C 11/4087* (2013.01); *G11C 11/4094* (2013.01); *G11C 16/08* (2013.01); *G11C 16/24* (2013.01); *H01L 23/50* (2013.01); *H01L 23/528* (2013.01); *H01L 24/06* (2013.01); *H01L 2224/05024* (2013.01); *H01L 2224/0612* (2013.01); *H01L 2924/1436* (2013.01); *H01L 2924/1438* (2013.01)

(58) Field of Classification Search
None
See application file for complete search history.

(56) References Cited

U.S. PATENT DOCUMENTS

| | | | | |
|---|---|---|---|---|
| 2005/0052192 A1* | 3/2005 | Hung | ................... | G01R 31/307 324/754.22 |
| 2010/0213611 A1* | 8/2010 | Isa | .......................... | H01L 23/13 257/738 |
| 2012/0326336 A1* | 12/2012 | Chou | ...................... | H01L 24/05 257/781 |

(Continued)

*Primary Examiner* — Harry W Byrne
*Assistant Examiner* — Sultana Begum
(74) *Attorney, Agent, or Firm* — William Park & Associates Ltd.

(57) ABSTRACT

A semiconductor device includes, a semiconductor chip having a first surface over which bonding pads are positioned, a second surface which faces away from the first surface, and a plurality of signal lines formed over the first surface, extending in a first direction; a plurality of redistribution lines formed over the first surface, having one set of ends electrically coupled to the bonding pads of the semiconductor chip, and extending in a direction oblique to the first direction; and a plurality of redistribution pads disposed over the first surface, and electrically coupled with an other set of ends of the redistribution lines which face away from the one set of ends.

20 Claims, 8 Drawing Sheets

(56) References Cited

U.S. PATENT DOCUMENTS

| | | | |
|---|---|---|---|
| 2013/0175075 A1* | 7/2013 | Kivikero | H01L 23/3114 174/260 |
| 2014/0050020 A1* | 2/2014 | Lee | G11C 7/1054 365/158 |
| 2014/0239514 A1* | 8/2014 | Haba | H01L 24/49 257/778 |

* cited by examiner

SEMICONDUCTOR DEVICE WITH DECREASED OVERLAPPING AREA BETWEEN REDISTRIBUTION LINES AND SIGNAL LINES

CROSS-REFERENCE TO RELATED APPLICATION

The present application claims priority under 35 U.S.C. §119(a) to Korean Patent Application No. 10-2015-0145251 filed in the Korean Intellectual Property Office on Oct. 19, 2015, which is incorporated herein by reference in its entirety.

BACKGROUND

1. Technical Field

Various embodiments generally relate to a semiconductor technology, and more particularly, to a semiconductor device having redistribution lines.

2. Related Art

Failure modes occurring in a semiconductor device exist in various types. Failure modes by electrical phenomena include electrical overstress (EOS) and electrostatic discharge (ESD).

An ESD phenomenon refers to a phenomenon that occurs as static electricity flows. Electrostatic current by the ESD phenomenon is likely to be applied to a diode or a transistor in a semiconductor device and destroy functionality of these elements. That is to say, high current by static electricity is applied between PN junctions of a diode and causes a junction spike, or breaks down the gate dielectric layer of a transistor and short-circuits a gate, a drain and a source, thereby markedly deteriorating reliabilities of the elements.

ESD phenomena are classified into a human body model (HBM), a machine model (MM) and a charged device model (CDM) according to causes of static electricity generation. The HBM represents a phenomenon that static electricity generated in a charged human body is momentarily discharged through an element in a semiconductor device and breaks down the element. The MM represents a phenomenon that static electricity generated in a charged machine is momentarily discharged through an element in a semiconductor device and breaks down the element. The CDM represents a phenomenon that static electricity accumulated in a semiconductor device in the course of manufacturing the semiconductor device is momentarily discharged through grounding with an external conductor and breaks down an element in the semiconductor device.

In the CDM, because the semiconductor device is broken down by itself by the charges charged in the semiconductor device, the CDM exerts a significant influence on the reliability of a product. Therefore, semiconductor device manufacturers are continually making efforts to measure a CDM property through charge discharge modeling and thereby secure a CDM property of a level demanded by customers.

SUMMARY

In an embodiment, a semiconductor device may include a semiconductor chip having a first surface over which bonding pads are positioned, a second surface which faces away from the first surface, and a plurality of signal lines formed over the first surface, extending in a first direction. The semiconductor device may also include a plurality of redistribution lines formed over the first surface, having one set of ends electrically coupled to the bonding pads, and extending in a direction oblique to the first direction. The semiconductor device may also include a plurality of redistribution pads disposed over the first surface, and electrically coupled with an other set of ends of the redistribution lines which face away from the one set of ends.

DETAILED DESCRIPTION

Hereinafter, a semiconductor device having redistribution lines will be described below with reference to the accompanying drawings through various embodiments.

Figure 1:
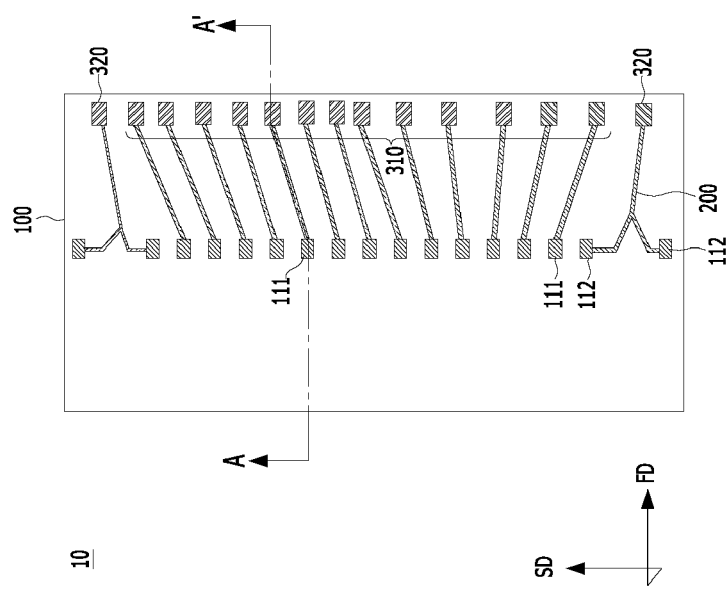
FIG. 1 is a top view illustrating a representation of an example of a semiconductor device in accordance with an embodiment.
Figure 2:
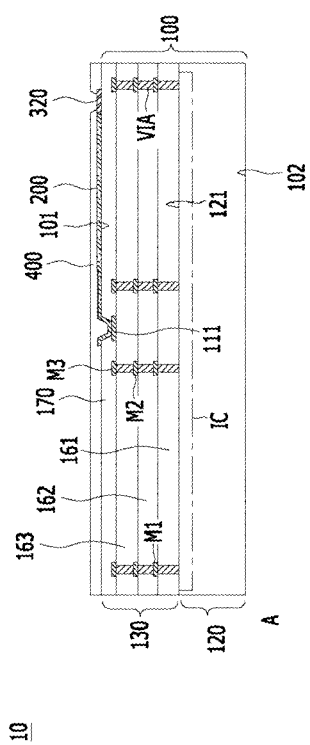
FIG. 2 is a cross-sectional view taken along the line A-A' of FIG. 1.

Referring to FIGS. 1 and 2, a semiconductor device 10 in an embodiment may include a semiconductor chip 100, and a plurality of redistribution lines 200 and a plurality of redistribution pads 310 and 320 formed on the semiconductor chip 100.

For the sake of convenience in explanation, a first direction FD and a second direction SD will be defined. The first direction FD may be a column direction, that is, a bit line direction. In addition, the second direction SD may be a row direction, that is, a word line direction.

The semiconductor chip 100 may have a first surface 101 and a second surface 102 which faces away from the first surface 101. The semiconductor chip 100 may have a plurality of bonding pads 111 and 112 disposed on the first surface 101. The bonding pads 111 and 112 may be arranged along the center portion of the first surface 101 of the semiconductor chip 100 in the second direction SD perpendicular to the first direction FD. The semiconductor chip 100 may be a center pad type chip. Further, the semiconductor chip 100 may be an edge pad type chip in which bonding pads are arranged adjacent to and along an edge of the first surface 101 of the semiconductor chip 100. While it is illustrated in an embodiment that the bonding pads 111 and 112 are formed in one line, it is to be noted that the bonding pads 111 and 112 may be formed in at least two lines.

The semiconductor chip 100 may include a base substrate 120 in which an integrated circuit IC is formed. The semiconductor chip 100 may also include an interconnect structure 130 formed on the base substrate 120.

The base substrate 120 may include a semiconductor substrate such as a bulk silicon substrate. Further, the base substrate 120 may include other semiconductor materials such as III group, IV group and/or V group elements. The base substrate 120 may have an active surface 121 and a non-active surface which faces away from the active surface 121. In addition, the non-active surface of the base substrate 120 may be substantially the same surface as the second surface 102 of the semiconductor chip 100. The integrated circuit IC of the semiconductor chip 100 may be formed to a partial depth of the base substrate 120 from the active surface 121.

The integrated circuit IC will be described below with reference to FIG. 3.

Figure 3:
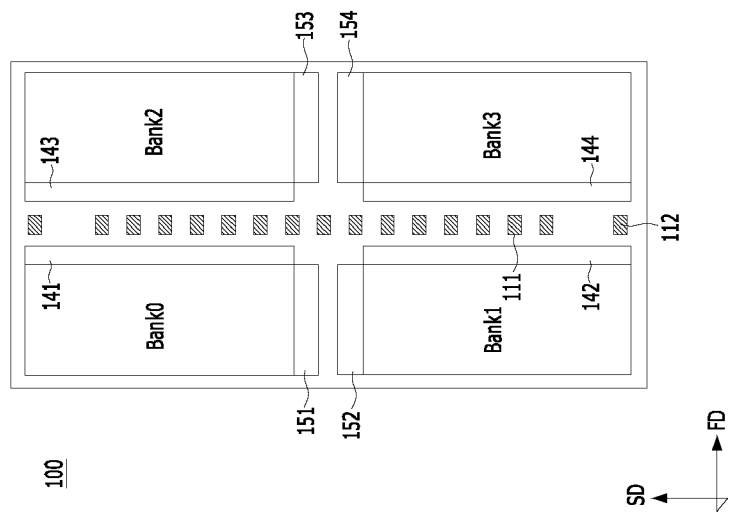
FIG. 3 is a top view illustrating integrated circuit of FIG. 2.

Referring to FIG. 3, the integrated circuit IC may include memory cell arrays Bank0 to Bank3, a plurality of column decoders 141 to 144, and a controller.

The memory cell arrays Bank0 to Bank3 may include a first memory bank Bank0 and Bank1 and a second memory bank Bank2 and Bank3 disposed separately from each other in the first direction FD with the bonding pads 111 and 112 interposed therebetween and selectively activated by a bank address signal.

Each of the first memory bank Bank0 and Bank1 and the second memory bank Bank2 and Bank3 may be disposed by being physically divided into a plurality of sub banks. In an embodiment, the first memory bank Bank0 and Bank1 may include a first sub bank Bank0 and a second sub bank Bank1 disposed in the second direction SD. In addition, the second memory bank Bank2 and Bank3 may include a third sub bank Bank2 and a fourth sub bank Bank3 disposed in the second direction SD.

A first row decoder 151 may correspond to the first sub bank Bank0. In addition, a second row decoder 152 may correspond to the second sub bank Bank1. The first row decoder 151 and the second row decoder 152 may be disposed between the first sub bank Bank0 and the second sub bank Bank1. Moreover, a third row decoder 153 may correspond to the third sub bank Bank2. Further, a fourth row decoder 154 may correspond to the fourth sub bank Bank3. The third row decoder 153 and the fourth row decoder 154 may be disposed between the third sub bank Bank2 and the fourth sub bank Bank3.

Each of the first to fourth row decoders 151 to 154 generates a decoded row address by decoding a row address provided from the controller. Further, each of the first to fourth row decoders 151 to 154 generates a word line driving signal for controlling selection of a word line of a sub bank corresponding to it based on the decoded row address.

The column decoders 141 to 144 may include first to fourth column decoders respectively corresponding to the first to fourth sub banks Bank0 to Bank3. Each of the first to fourth column decoders 141 to 144 may be disposed side by side with a sub bank corresponding to it when viewed in the first direction FD, adjacent to the bonding pads 111 and 112. Each of the first to fourth column decoders 141 to 144 may generate a decoded column address by decoding a column address provided from the controller. Further, each of the first to fourth column decoders 141 to 144 may generate a column select signal for controlling selection of a bit line of a sub bank corresponding to it, based on the decoded column address.

The controller may generate a row address and a column address in response to an address signal inputted from an exterior device or source. The first to fourth sub banks Bank0 to Bank3 may include pluralities of memory cells. The first to fourth sub banks Bank0 to Bank3 may operate in response to column select signals provided from the first to fourth column decoders 141 to 144 and word line driving signals provided from the first to fourth row decoders 151 to 154. Constructions of the sub banks Bank0 to Bank3 will be described below with reference to FIG. 4.

Figure 4:
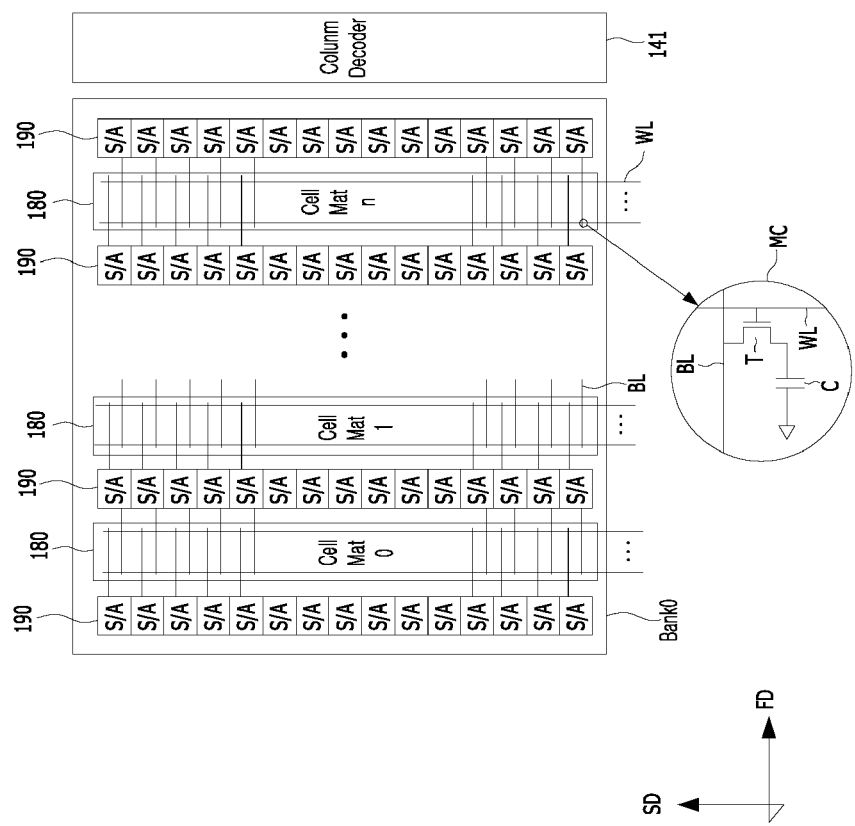
FIG. 4 is a block diagram illustrating a sub bank and a column decoder of FIG. 3.

Referring to FIG. 4, a diagram illustrating a sub bank and a column decoder of FIG. 3 is described. In particular, FIG. 4 illustrates the first sub bank Bank0 and the first column decoder 141 of FIG. 3. The remaining sub banks Bank1 to Bank3 and the remaining column decoders 142 to 144 are realized in a manner similar to the first sub bank Bank0 and the first column decoder 141 shown in FIG. 4.

In FIG. 4, the first sub bank Bank0 may have a structure in which a plurality of cell mats 180 and a plurality of bit line sense amplifier blocks 190 are repeatedly disposed in the first direction FD. Bit line sense amplifier blocks 190 may be respectively disposed on left and right sides of each cell mat 180. To maximize the efficiency of the bit line sense amplifier blocks 190 and reduce a chip area, the first sub bank Bank0 may have a shared bit line sense amplifier structure in which one bit line sense amplifier block 190 is used in common for cell mats 180 disposed on the left and right sides thereof.

In each of the cell mats 180, a plurality of bit lines BL which extend in the first direction FD, a plurality of word lines WL which extend in the second direction SD, and a plurality of memory cells MC which are disposed at intersections of the bit lines BL and the word lines WL may be formed. The memory cells MC may be DRAM cells each constructed by one transistor T and one capacitor C, and the semiconductor chip 100 may be DRAM chips.

The reference symbol S/A designates sense amplifiers which are included in the bit line sense amplifier blocks 190. Each of the bit line sense amplifier blocks 190 may include a plurality of sense amplifiers S/A which are arranged in the second direction SD.

The first column decoder 141 may be disposed side by side with the first sub bank Bank0 when viewed in the first direction FD. The first column decoder 141 may generate a decoded column address by decoding a column address signal provided from the controller and generate a column select signal based on the decoded column address.

Figure 5:
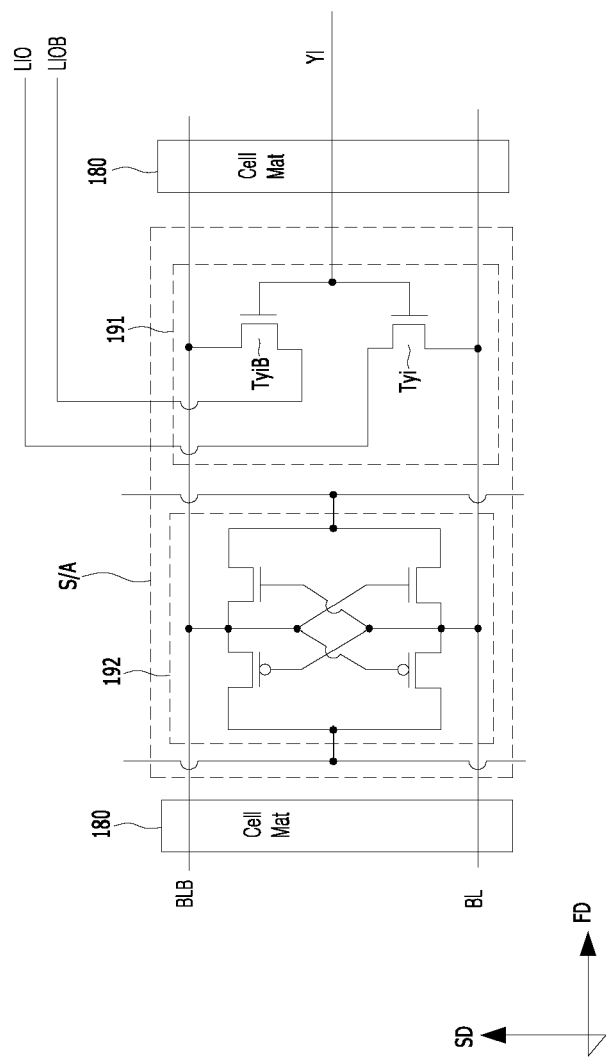
FIG. 5 is a diagram illustrating the circuit configuration of a sense amplifier of FIG. 4.

Referring to FIG. 5, a circuit diagram illustrating a portion of the first sub bank Bank0 of FIG. 4 is described.

The reference symbol YI shown in FIG. 5 designates a column select line for transferring a column select signal generated by the first column decoder 141 (see FIG. 4). The column select line YI may extend in the first direction FD.

In FIG. 5, the sense amplifier S/A may include a column selecting section 191 and a bit line sense amplifier 192. Column select transistors Tyi and TyiB included in the column selecting section 191 may be electrically coupled between local input/output lines LIO and LIOB and bit lines BL and BLB. The column select transistors Tyi and TyiB may select the bit lines BL and BLB in response to the column select signal provided through the column select line YI and electrically couple the selected bit lines BL and BLB with the local input/output lines LIO and LIOB. The local input/output lines LIO and LIOB may electrically couple the bit lines BL and BLB with global input/output lines. Further, the local input/output lines LIO and LIOB may extend in the first direction FD.

The bit line sense amplifier 192 may amplify data outputted from a cell mat 180 and transfer amplified data to the local input/output lines LIO and LIOB. In the alternative, the bit line sense amplifier 192 may transfer data inputted through the local input/output lines LIO and LIOB to the cell mat 180.

Although it is illustrated as an example in an embodiment described above with reference FIGS. 3 to 5 that the semiconductor chip 100 is DRAM chip, it is to be noted that an embodiment is not limited to such an example. The semiconductor chip 100 may be other kind of memory chip such as NAND chip and MRAM chip and the configuration of the integrated circuit may be changed according to a kind of chip. For example, while not shown, where the semiconductor chip 100 is NAND chip, the integrated circuit IC of the semiconductor chip 100 may include a memory cell array which has a plurality of cell strings constructed by drain select transistors. The integrated circuit IC may also include pluralities of flash memory cells and source select transistors electrically coupled in series between bit lines and source lines, a column decoder disposed in a column direction with respect to the memory cell array and that generates a column select signal for controlling selection of a bit line of the memory cell array. The integrated circuit IC may also include a page buffer disposed between the memory cell array and the column decoder and that controls electrical coupling between the bit lines and local input/output lines in response to the column select signal. The integrated circuit IC may also include a row decoder which generates a word line driving signal for controlling selection of a word line of the memory cell array.

Referring again to FIG. 2, the interconnect structure 130 may include one or more wiring layers formed on the active surface 121 of the base substrate 120. The interconnect structure 130 may include pluralities of metal lines M1, M2 and M3 electrically coupled with the integrated circuit IC. In an embodiment, the interconnect structure 130 has a TLM (three layer metal) structure. The interconnect structure 130 includes a first wiring layer in which the first metal lines M1 are positioned. The interconnect structure 130 also includes a second wiring layer formed over the first wiring layer and in which the second metal lines M2 are positioned. The interconnect structure 130 also includes a third wiring layer formed over the second wiring layer and in which the third metal lines M3 are positioned.

The interconnect structure 130 may further include a plurality of interlayer dielectric layers 161, 162 and 163 formed between the wiring layers and that insulate the metal lines M1, M2 and M3 formed in the different wiring layers from one another. The interconnect structure 130 may also include conductive vias VIA which pass through the interlayer dielectric layers 161, 162 and 163 and electrically couple the metal lines M1, M2 and M3 formed in the different wiring layers. The metal lines M1, M2 and M3 and the conductive vias VIA may be formed of an alloy including copper, aluminum or another metal, and may be formed by using a damascene process.

The bonding pads 111 and 112 may be formed in the uppermost wiring layer of the interconnect structure 130. For reference, FIG. 2 as a cross-sectional view taken along the line A-A' of FIG. 1 shows only the bonding pads 111 and does not show the bonding pads 112, it is to be understood that not only the bonding pads 111 but also the bonding pads 112 are formed in the uppermost wiring layer of the interconnect structure 130.

A protective layer 170 which covers the metal lines M3 formed in the uppermost wiring layer and exposes the bonding pads 111 and 112 may be formed on the uppermost interlayer dielectric layer 163. The top surface of the protective layer 170 as the uppermost layer of the semiconductor chip 100 may be substantially the same surface as the first surface 101 of the semiconductor chip 100.

The interconnect structure 130 of the semiconductor chip 100 may include signal lines which extend in the first direction FD.

The construction of these signal lines will be described below with reference to FIG. 6.

Figure 6:
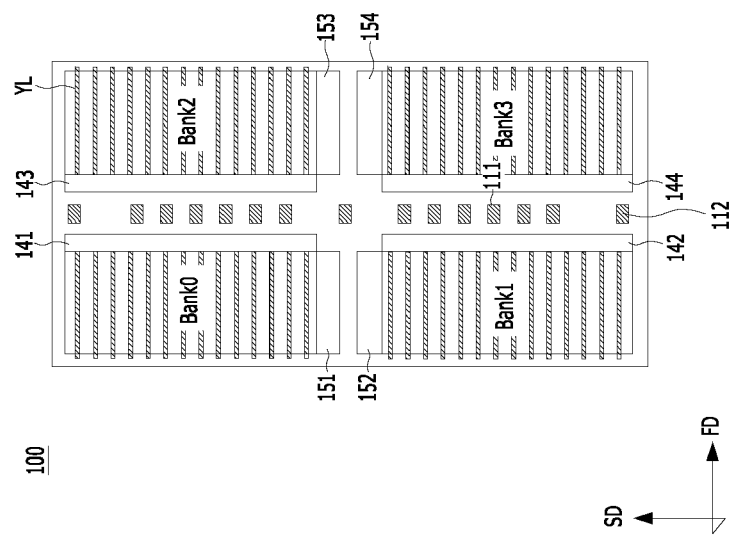
FIG. 6 is a top view illustrating signal lines included in the semiconductor chip of FIG. 1.

Referring to FIG. 6, the signal lines YL may extend from the center portion of the semiconductor chip 100 where the bonding pads 111 and 112 are positioned to the edge of the semiconductor chip 100 in the first direction FD. The signal lines YL may be arranged in the second direction SD perpendicular to the first direction FD. The signal lines YL may be disposed over the entire surfaces of the semiconductor chip 100. The signal lines YL may have a predetermined width and a predetermined space.

The signal lines YL may be disposed in the uppermost wiring layer of the interconnect structure 130 shown in FIG. 2, that is, in the same layer as the third metal lines M3. However, it is to be noted that the embodiment is not limited to such a configuration. The signal lines YL may be disposed in the wiring layer lying under the uppermost wiring layer. Further, the signal lines YL may be disposed in such a way as to be distributed in at least two wiring layers.

The signal lines YL may be column select lines YI (see FIG. 5) for transferring column select signals generated by the column decoders 141 to 144 to the first to fourth sub banks Bank0 to Bank3. In addition, the signal lines YL may be local input/output lines LIO and LIOB (see FIG. 5) which electrically couple bit lines and global input/output lines.

Referring again to FIGS. 1 and 2, the redistribution lines 200 may be disposed on the first surface 101 of the semiconductor chip 100. The redistribution lines 200 may have one set of ends which are respectively electrically coupled to the bonding pads 111 and 112. The redistribution lines 200 may have another set of ends facing away from the one set of ends and disposed on the edge of the first surface 101 of the semiconductor chip 100.

The redistribution pads 310 and 320 may be formed on the first surface 101 of the semiconductor chip 100 to be electrically coupled with the other set of ends of the redistribution lines 200. In an embodiment, the redistribution pads 310 and 320 are arranged in the second direction SD, adjacent to and along the edges of the semiconductor chip 100.

As the number of bonding pads is increased due to improvement in degree of integration and multi-functionality, the number of redistribution pads corresponding thereto is also increased. In particular, in the case of electrically coupling bonding pads and redistribution pads by using redistribution lines formed in a single layer, if the redistribution pads are disposed to be aligned with the bonding pads corresponding to them in the first direction FD, it is possible to dispose a maximum number of redistribution pads within a limited footprint. In this case, the redistribution lines which electrically couple the redistribution pads and the bonding pads are structured to extend in the first direction FD.

However, because pluralities of signal lines which extend in the first direction FD are distributed over the semiconductor chip 100, the redistribution lines and the signal lines overlap with each other when the redistribution lines are formed in the first direction FD. The redistribution lines and the signal lines overlap with each other, and a dielectric layer are interposed between the redistribution lines and the signal lines. Accordingly, capacitors may be formed by the redistribution lines, the signal lines and the dielectric layer interposed therebetween. When voltages are applied to the redistribution lines and the signal lines during the manufacturing of the semiconductor chip 100, charges are accumulated in the capacitor. The accumulated charges are discharged at a moment that the semiconductor chip 100 is contact with an external ground. High current generated at the moment can cause a permanent damage to internal circuitry of the semiconductor chip 100. In other words, if the overlapping area between the redistribution lines and the signal lines is large, CDM property may be degraded. To improve the CDM property, it is necessary to decrease the overlapping area between the redistribution lines and the signal lines.

Figure 7:
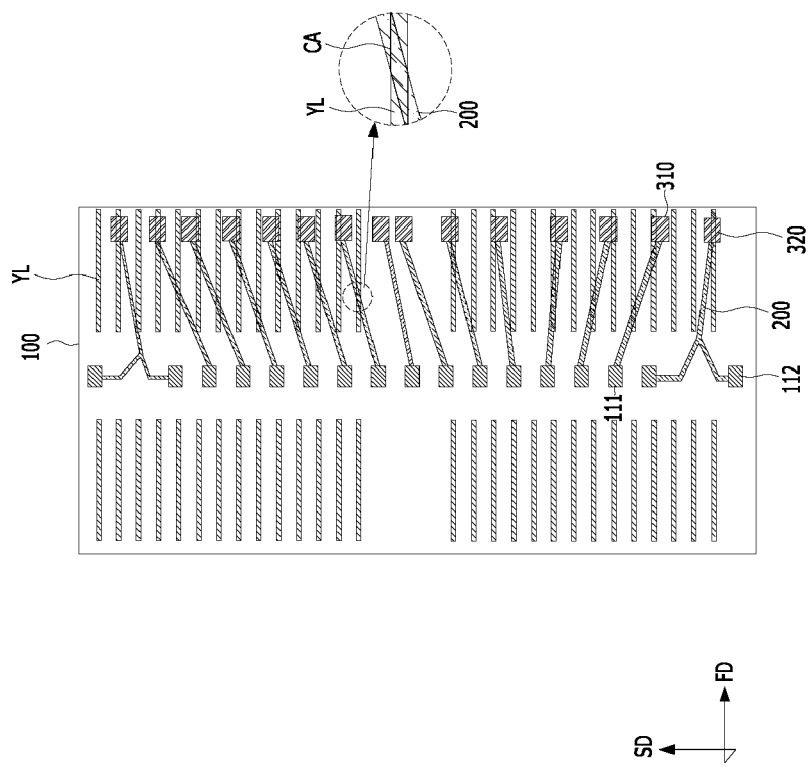
FIG. 7 is a top view illustrating signal lines and redistribution lines in an overlapped manner.

Referring to FIG. 7, the redistribution lines 200 in accordance with an embodiment are formed in a direction oblique to the extending direction of the signal lines YL, that is, the first direction FD. As the redistribution lines 200 are formed in the direction oblique to the first direction FD, at least one of the redistribution lines 200 may cross with at least one of the signal lines YL.

According to an embodiment described above, the redistribution lines 200 and the signal lines YL overlap with each other at only crossing points CR where the redistribution lines 200 and the signal lines YL cross. Accordingly, an amount of charges charged at the overlapping portions between the redistribution lines 200 and the signal lines YL may be minimized. In addition, a CDM property may be improved.

If the redistribution lines 200 are formed in the direction oblique to the first direction FD, an intervals between the redistribution pads 310 and 320 are increased when compared to where the redistribution lines 200 are formed in the first direction FD. Therefore, under this condition, a larger space for disposing redistribution pads is required, thereby a size of the semiconductor chip 100 can be increased. To prevent an increase in size of the semiconductor chip 100, it is necessary to design the semiconductor chip 100 using redistribution pads the number of which is smaller than the number of the bonding pads 111 and 112.

Referring again to FIG. 1, the bonding pads 111 and 112 of the semiconductor chip 100 may include a plurality of input pads and a plurality of output pads. The input pads may include a CS pad for the input of a chip select signal (CS), a CKE pad for the input of a clock enable signal (CKE), a ZQ pad for the input of a test signal (ZQ), an ODT pad for the input of a termination control signal (ODT), ADD pads for the input of an address signal (ADD), a CK pad for the input of a clock signal (CK), a BA pad for the input of a bank address signal (BA), a CAS pad for the input of a column address strobe signal (CAS), a RAS pad for the input of a row address strobe signal (RAS), a VDD pad for the input of a power supply voltage (VDD), a VSS pad for the input of a ground voltage (VSS), and so forth. In particular, the VDD pad and the VSS pad may be disposed by at least two in the semiconductor chip 100.

Among the bonding pads 111 and 112 of the semiconductor chip 100, one or more bonding pads which may be electrically coupled with other bonding pads without causing any problem exist. Such bonding pads may include the VDD pads, or the VSS pads. The VDD pads included in the semiconductor chip 100 may be electrically coupled to each other without causing any problem. In addition, the VSS pads included in the semiconductor chip 100 may be electrically coupled to each other without causing any problem. The remaining bonding pads other than the VDD pads and the VSS pads should not be electrically coupled with the other bonding pad, or, should be electrically isolated from the other bonding pad.

In the following descriptions, for the sake of convenience in explanation, bonding pads which should be electrically isolated from the other bonding pad will be defined as first bonding pads 111. In addition, bonding pads which may be electrically coupled with the other bonding pad without causing any problem will be defined as second bonding pads 112.

The redistribution pads 310 and 320 may include individual redistribution pads 310 which correspond to the first bonding pads 111 and one or more shared redistribution pads 320 which each correspond in common to two or more second bonding pads 112.

The individual redistribution pads 310 are respectively individually electrically coupled to the first bonding pads 111 through the redistribution lines 200. The respective shared redistribution pads 320 are electrically coupled in common to the two or more second bonding pads 112. The respective shared redistribution pads 320 are shared by the two or more second bonding pads 112. Accordingly, it is possible to design the semiconductor chip 100 using redistribution pads the number of which is smaller than the number of the bonding pads 111 and 112.

Referring again to FIG. 2, a dielectric layer pattern 400 which covers the redistribution lines 200 and exposes the redistribution pads 310 and 320 may be additionally formed on the first surface 101 of the semiconductor chip 100.

The above-described semiconductor device may be applied to various electronic system and semiconductor package modules.

Figure 8:
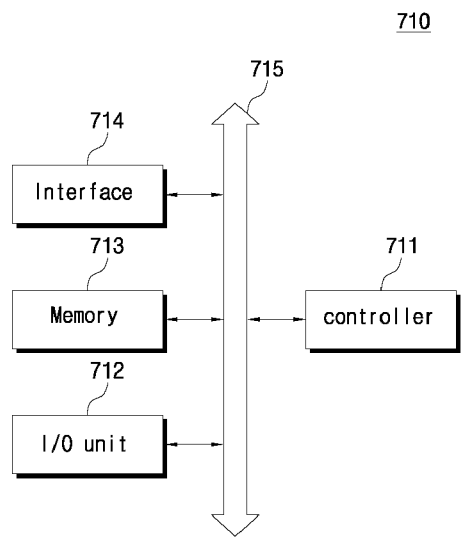
FIG. 8 is a block diagram illustrating a representation of an example of an electronic system which includes the semiconductor device in accordance with an embodiment.

Referring to FIG. 8, the semiconductor device in accordance with an embodiment may be applied to an electronic system 710. The electronic system 710 may include a controller 711, an input/output unit 712, and a memory 713. The controller 711, the input/output unit 712 and the memory 713 may be electrically coupled with one another through a bus 715. The bus 715 accordingly provides a data movement path.

For example, the controller 711 may include at least one microprocessor, at least one digital signal processor, at least one microcontroller, and at least one of logic circuits capable of performing the same functions as these components. The memory 713 may include the semiconductor device in accordance with an embodiment. The input/output unit 712 may include at least one selected among a keypad, a keyboard, a display device, a touch screen, and so forth. The memory 713 as a device for storing data may store data or/and commands to be executed by the controller 711 or the like.

The memory 713 may include a volatile memory device such as a DRAM or/and a nonvolatile memory device such as a flash memory. For example, a flash memory may be mounted to an information processing system such as a mobile terminal or a desk top computer. The flash memory may be configured as a solid state drive (SSD). In this case, the electronic system 710 may stably store a large amount of data in a flash memory system.

The electronic system 710 may further include an interface 714 set to be able to transmit and receive data to and from a communication network. The interface 714 may be a wired or wireless type. For example, the interface 714 may include an antenna, a wired transceiver or a wireless transceiver.

The electronic system 710 may be understood as a mobile system, a personal computer, a computer for an industrial use or a logic system which performs various functions. For example, the mobile system may be any one among a personal digital assistant (PDA), a portable computer, a tablet computer, a mobile phone, a smart phone, a wireless phone, a laptop computer, a memory card, a digital music system and an information transmission/reception system.

Where the electronic system 710 is a device capable of performing wireless communication, the electronic system 710 may be used in a communication system such as CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 9:
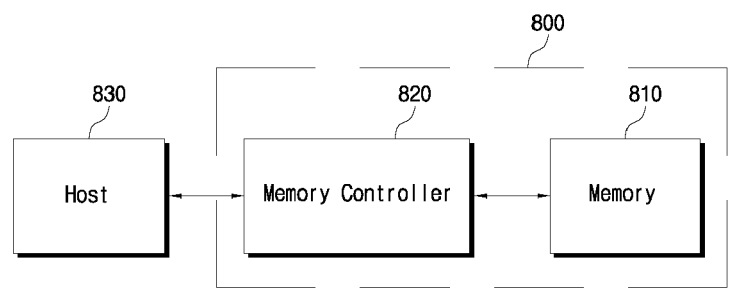
FIG. 9 is a block diagram illustrating a representation of an example of a memory card which includes the semiconductor device in accordance with an embodiment.

Referring to FIG. 9, the semiconductor device in accordance with an embodiment may be provided in the form of a memory card 800. For example, the memory card 800 may include a memory 810 such a nonvolatile memory device and a memory controller 820. The memory 810 and the memory controller 820 may store data or read stored data.

The memory 810 may include at least any one among nonvolatile memory devices to which the semiconductor device in accordance with an embodiment is applied. Further, the memory controller 820 may control the memory 810 to read stored data or store data in response to a read/write request from a host 830.

While various embodiments have been described above, it will be understood to those skilled in the art that the embodiments described are by way of examples only. Accordingly, the semiconductor chip module and the semiconductor device including the same described herein should not be limited based on the described embodiments above.

What is claimed is:

1. A semiconductor device comprising:
a semiconductor chip having a first surface over which bonding pads are positioned, a second surface which faces away from the first surface, and a plurality of signal lines formed over the first surface, extending in a first direction;
a plurality of redistribution lines formed over the first surface, having one set of ends electrically coupled to the bonding pads, and extending in a direction oblique to the first direction; and
a plurality of redistribution pads disposed over the first surface, and electrically coupled with an other set of ends of the redistribution lines which face away from the one set of ends,
wherein the redistribution pads comprise:
one or more shared redistribution pads electrically coupled in common to two or more of the bonding pads; and
a plurality of individual redistribution pads individually electrically coupled to the bonding pads which are not electrically coupled with the one or more shared redistribution pads.

2. The semiconductor device according to claim 1, wherein the signal lines have a predetermined width and a predetermined space, and are arranged in a second direction perpendicular to the first direction.

3. The semiconductor device according to claim 1, wherein the semiconductor chip comprises:
a base substrate;
an integrated circuit formed in the base substrate; and
an interconnect structure formed only over the base substrate, and having one or more wiring layers including a wiring layer in which the signal lines are disposed.

4. The semiconductor device according to claim 3, wherein the interconnect structure includes two or more wiring layers, and the signal lines are disposed in an uppermost wiring layer of the two or more wiring layers.

5. The semiconductor device according to claim 3, wherein the interconnect structure includes two or more wiring layers, and the signal lines are disposed by being distributed in at least two of the two or more wiring layers.

6. The semiconductor device according to claim 3, wherein the interconnect structure includes two or more wiring layers, and the bonding pads are disposed in an uppermost wiring layer of the two or more wiring layers.

7. The semiconductor chip module according to claim 3, wherein the integrated circuit comprises:
a memory cell array including bit lines, word lines which extend in perpendicular to the bit lines, and a plurality of memory cells which are disposed at intersections of the bit lines and the word lines; and
a column decoder configured to generate a column select signal for controlling selection of the bit lines.

8. The semiconductor device according to claim 7, wherein the bit lines extend in the first direction, and the word lines extend in a second direction perpendicular to the first direction.

9. The semiconductor device according to claim 7, the memory cell array and the column decoder are arranged in the first direction.

10. The semiconductor device according to claim 7, wherein the memory cell array further includes column select transistors which are electrically coupled between the bit lines and local input/output lines, select bit lines in response to the column select signal, and electrically couples the selected bit lines and the local input/output lines.

11. The semiconductor device according to claim 10, wherein the signal lines comprise column select lines for transferring the column select signal generated by the column decoder to the column select transistors.

12. The semiconductor device according to claim 10, wherein the signal lines comprise the local input/output lines.

13. The semiconductor device according to claim 1, wherein the bonding pads are arranged along a center portion of the first surface, and the redistribution pads are arranged adjacent to and along edges of the first surface.

14. The semiconductor device according to claim 1, wherein the redistribution pads are arranged in a second direction perpendicular to the first direction.

15. The semiconductor device according to claim 1, wherein the redistribution lines are disposed in a single layer.

16. The semiconductor device according to claim 1, wherein at least one of the signal lines and at least one of the redistribution lines cross, and the signal lines and the redistribution lines overlap only at crossing points where they cross with each other.

17. The semiconductor device according to claim 1, further comprising:
a dielectric layer pattern, which covers the redistribution lines and exposes the redistribution pads, and is formed on the first surface of the semiconductor chip.

18. The semiconductor device according to claim 1, wherein the bonding pads comprise:
first bonding pads electrically coupled with the individual redistribution pads through the redistribution lines; and
second bonding pads electrically coupled with the shared redistribution pads through the redistribution lines.

19. The semiconductor device according to claim 18, wherein the second bonding pads comprise input pads for input of a ground voltage or input pads for input of a power supply voltage.

20. The semiconductor device of claim 1, wherein a number of the one or more redistribution pads is less than a number of the bonding pads.

\* \* \* \* \*